United States Patent
Hsu

(10) Patent No.: US 8,099,649 B2
(45) Date of Patent: Jan. 17, 2012

(54) DATA PROCESSING METHOD AND COMPUTER SYSTEM MEDIUM THEREOF

(75) Inventor: Yueh-Teng Hsu, Taipei (TW)

(73) Assignee: Lite-On Technology Corporation, Taipei (TW)

(*) Notice: Subject to any disclaimer, the term of this patent is extended or adjusted under 35 U.S.C. 154(b) by 894 days.

(21) Appl. No.: 12/155,589

(22) Filed: Jun. 6, 2008

(65) Prior Publication Data

US 2009/0055712 A1   Feb. 26, 2009

(30) Foreign Application Priority Data

Aug. 20, 2007  (TW) .............. 96130784 A

(51) Int. Cl.
H03M 13/00 (2006.01)
H03M 13/03 (2006.01)
G06F 11/10 (2006.01)

(52) U.S. Cl. ........ 714/759; 714/781; 714/784; 714/785; 714/793; 714/808

(58) Field of Classification Search .......... 714/759, 714/781, 784, 785, 793, 808
See application file for complete search history.

(56) References Cited

U.S. PATENT DOCUMENTS

| 5,381,425 A * | 1/1995 | Bitzer et al. ............. 714/793 |
| 6,263,470 B1 | 7/2001 | Hung et al. |
| 7,996,745 B2 * | 8/2011 | Griseta et al. ............ 714/758 |
| 7,996,748 B2 * | 8/2011 | Griseta et al. ............ 714/785 |
| 2007/0011601 A1 * | 1/2007 | Griseta et al. ............ 714/805 |
| 2008/0307289 A1 * | 12/2008 | Hsu .......................... 714/759 |
| 2009/0031193 A1 * | 1/2009 | Chang ...................... 714/759 |

OTHER PUBLICATIONS

Lattice Semiconductor Corp., Ref. Design RD1025 ECC Module, Apr. 2005, pp. 1-10.*
May et al. The Ribosome as a Table-Driven Convolutional Decoder for the *Escherichia coli* K-12 Translation Initiation System, Jul. 23-28, 2000, IEEE, pp. 2466-2469.*

* cited by examiner

*Primary Examiner* — John J Tabone, Jr.
(74) *Attorney, Agent, or Firm* — Li & Cai Intellectual Property (USA) Office

(57) ABSTRACT

A data processing method includes the steps of: initializing a syndrome vector to be an $(n-1)^{th}$ symbol; finding a corresponding mask based on the syndrome vector, wherein the mask is zero when the $(n-1)^{th}$ symbol is zero; correcting a known constant, which is zero when the syndrome vector is zero, based on the mask; inputting the syndrome vector to a log look-up table to correspondingly find log data; performing a modulo addition operation corresponding to log maximum data to find a log sum based on the log data and a log known constant; and inputting the log sum to an anti-log look-up table to correspondingly find operational data.

19 Claims, 4 Drawing Sheets

US 8,099,649 B2

DATA PROCESSING METHOD AND COMPUTER SYSTEM MEDIUM THEREOF

This application claims the benefit of Taiwan application Serial No. 96130784, filed Aug. 20, 2007, the subject matter of which is incorporated herein by reference.

BACKGROUND OF THE INVENTION

1. Field of the Invention

The invention relates in general to a data processing method, and more particularly to a data processing method applied to a syndrome operation of a Reed-Solomon code.

2. Description of the Related Art

In the current age, in which the technology development changes with each passing day, an error correction code has been widely used in various occasions, such as a satellite communication system, a wireless communication system, a digital video broadcasting system, a cable modem, a computer memory, an optical disc drive and a wireless local area network. A Reed-Solomon code is mostly frequently seen among these occasions because it has the very excellent efficiency behavior in the aspect of error correction. However, the operation amount required by the decoding of the Reed-Solomon code is very huge, so the operation is usually processed by hardware. If the operation is to be performed in a processor by way of program decoding, the operation amount is inevitably too huge so that the decoding speed is too slow. Thus, in the application of a communication apparatus having some software defined operations, such as a software defined radio (SDR), increasing the program decoding speed of the Reed-Solomon code is always one of the directions to be sought in the industry.

The decoding of the Reed-Solomon code main includes the steps of calculating a syndrome, finding an error location and finding an error value. When the above-mentioned steps are performed in the processor by way of the program decoding, about 60% of operation time are spent in the step of calculating the syndrome. Thus, if the processing time in the step of calculating the syndrome can be effectively shortened, the decoding speed of the Reed-Solomon code can be effectively increased.

FIG. 1 (Prior Art) is a flow chart showing a conventional operation method of calculating a syndrome by way of program decoding. First, as shown in step 102, indexes i and j of inner and outer loops are initialized to be equal to 0 and 1, respectively. Next, as shown in step 104, a constant $\alpha^i$ is acquired from a memory, and a parameter $\beta$ is caused to be equal to the constant $\alpha^i$, wherein $\alpha$ pertains to a finite field element. Then, as shown in step 106, a symbol $r_0$ is received, and a syndrome function $S_j$ is initialized to be the symbol $r_0$. Next, as shown in step 108, a Galois field multiplication is to be obtained to multiply the syndrome function $S_j$ and the parameter $\beta$ together. In step 108, log parameters GF_LOG [Si] and GF_LOG [$\beta$] are correspondingly found according to the syndrome function $S_j$ and the parameter $\beta$ by looking a log look-up table GF_LOG. Then, a Galois field addition is performed to obtain a log sum LOGSUM, which satisfies:

LOGSUM=(GF_LOG [$S_j$]+GF_LOG [$\beta$])MOD [$P$−1].

Thereafter, an anti-log look-up table GF_EXP is looked up to correspondingly find an operation result GF_EXP [LOGSUM], which is equal to a Galois field multiplication result of the syndrome function $S_j$ and the parameter $\beta$, which is to be obtained. Then, as shown in step 110, the Galois field addition is performed according to the operation result GF_EXP[LOGSUM] and the symbol $r_0$, and the operation result is saved as the syndrome function $S_j$. Next, it is judged whether the syndrome operation is finished or not, and the syndrome operation is ended if yes, or otherwise the above-mentioned steps are repeated, as sequentially shown in steps 112 to 118.

According to the above-mentioned operation steps, it is obtained that the log operation is performed on the parameter $\beta$ and the syndrome function $S_j$ in the conventional operation of calculating the syndrome by way of the program decoding. Then, the log parameters found through the log operation above are added together to find log operation data, and an anti-log operation is performed on the log operation data. However, the range of the values of the symbols $r_0$ and $r_j$ may cover 0, and performing the log operation on the value 0 will find an unreasonable operation result. Thus, the conventional operation of calculating the syndrome by way of the program decoding has to judge whether the values of the symbols $r_0$ and $r_j$ are equal to 0. Thereafter, branched operations are performed so that different operations may be performed on the received data having the zero and non-zero values. The branched operation paths disable the conventional processor, which calculates the syndrome by way of the program decoding, from increasing its operation speed through its pipe line structure or vectorization instruction set. Thus, the conventional operation method of calculating the syndrome by way of the program decoding and the operation of decoding the Reed-Solomon code have to occupy a lot of processor operation resources, and the operation speeds thereof are slower.

SUMMARY OF THE INVENTION

The invention is directed to a data processing method and a computer system medium capable of storing the data processing method. Compared with a conventional finite field data processing method applied to a Reed-Solomon code, the method of the invention advantageously occupies the fewer operation resources and has the advantage of the higher operation speed.

According to a first aspect of the present invention, a data processing method is provided. The method includes the steps of: initializing a syndrome vector to be an $(n-1)^{th}$ symbol; finding a corresponding mask based on the syndrome vector, wherein a value of the mask is equal to 0 when a value of the $(n-1)^{th}$ symbol is equal to 0; correcting a known constant based on the mask, wherein a value of the known constant corrected based on the mask is equal to 0 when a value of the syndrome vector is equal to 0; inputting the syndrome vector to a log look-up table to correspondingly find log data; performing, based on the log data and a log known constant, a modulo addition operation corresponding to log maximum data to find a log sum; and inputting the log sum to an anti-log look-up table to correspondingly find operational data.

According to a second aspect of the present invention, a computer system medium having a computer-executable instruction for performing a data processing method is provided. The data processing method comprising the steps of: initializing a syndrome vector to be an $(n-1)^{th}$ symbol; finding a corresponding mask according to the syndrome vector, wherein a value of the mask is equal to 0 when a value of the $(n-1)^{th}$ symbol is equal to 0; correcting a known constant based on the mask, wherein a value of the known constant corrected based on the mask is equal to 0 when a value of the syndrome vector is equal to 0; inputting the syndrome vector to a log look-up table to correspondingly find log data; performing, based on the log data and a log known constant, a modulo addition operation corresponding to log maximum data to find a log sum; and inputting the log sum to an anti-log look-up table to correspondingly find operational data.

The invention will become apparent from the following detailed description of the preferred but non-limiting embodiments. The following description is made with reference to the accompanying drawings.

DETAILED DESCRIPTION OF THE INVENTION

The data processing method of this embodiment can eliminate branched operations after the step of judging whether a value of the received data is equal to 0 in the conventional finite field data operating method by modifying contents of a log look-up table and an anti-log look-up table and generating a mask for adjusting a known constant.

Figure 1:
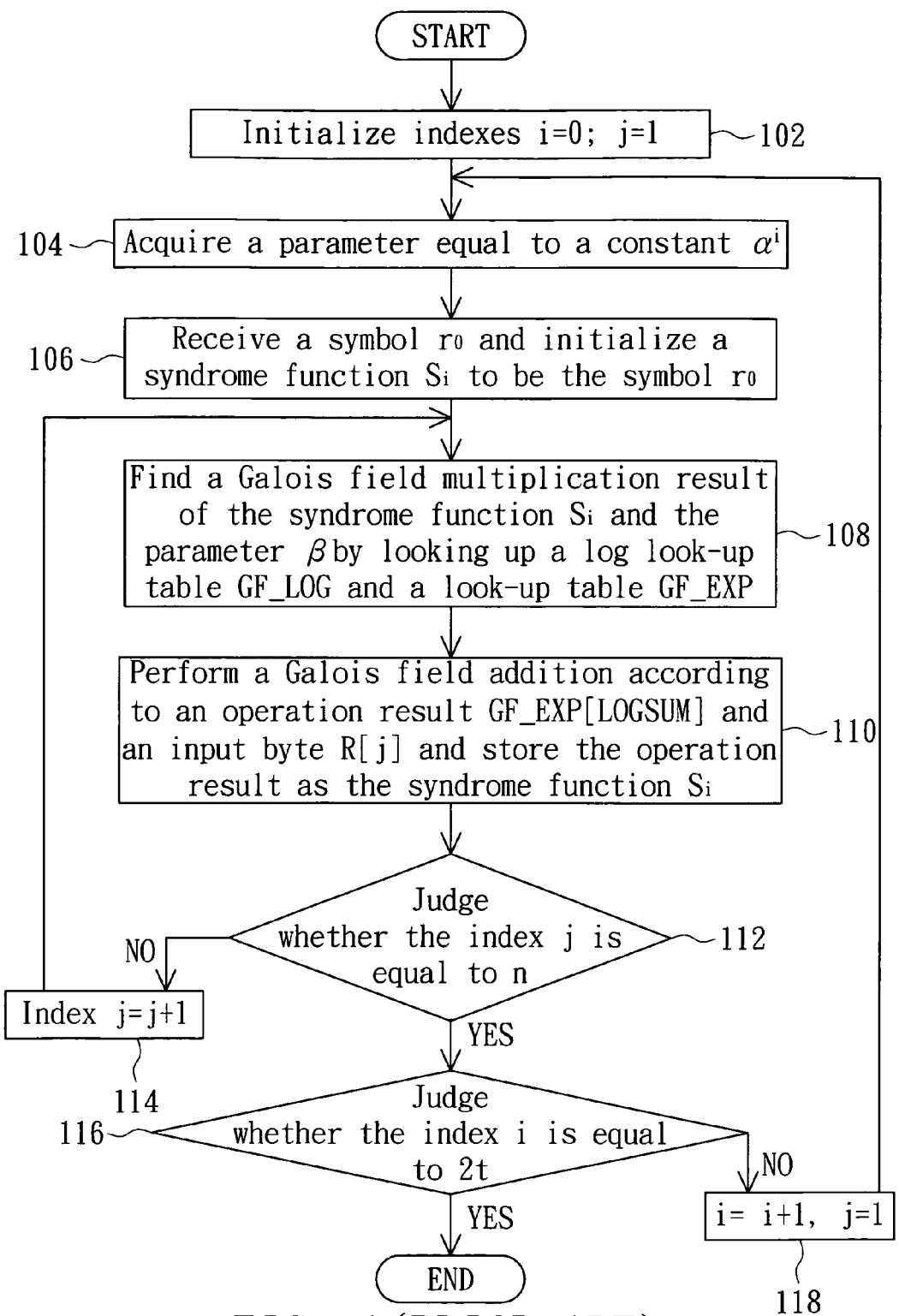
FIG. 1 (Prior Art) is a flow chart showing a conventional data processing method.
Figure 2:
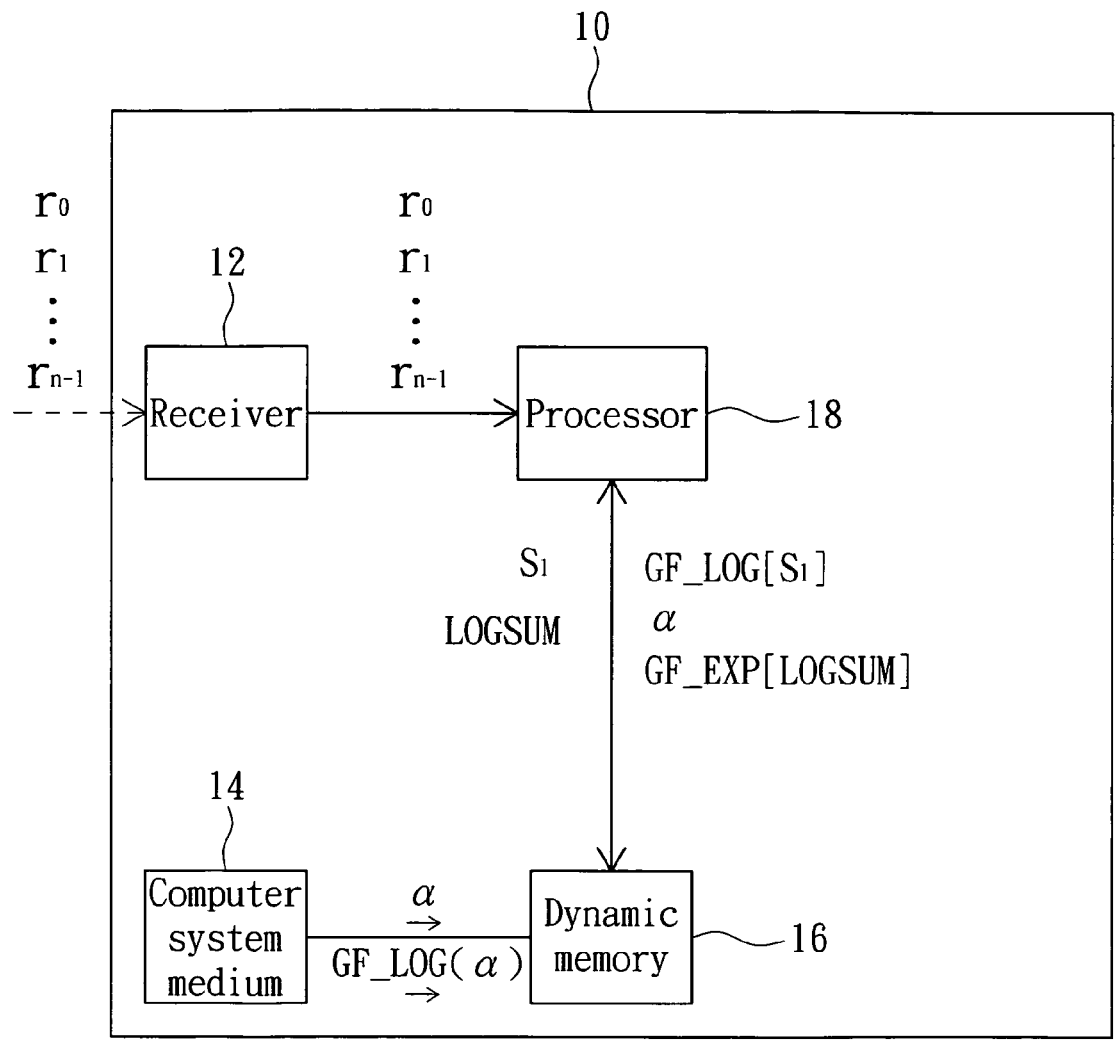
FIG. 2 is a block diagram showing a computer system applying a data processing method according to an embodiment of the invention.

The data processing method of this embodiment may be applied to various occasions which need finite field multiplication and addition operations. In the illustrated embodiment, the application of the decoding operation of the Reed-Solomon code is described. FIG. 2 is a block diagram showing a computer system 10 applying a data processing method according to an embodiment of the invention. Referring to FIG. 2, the computer system 10 includes a receiver 12, a computer system medium 14, a dynamic memory 16 and a processor 18. The computer system medium 14, such as a read only memory (ROM), stores program codes of performing the decoding operation of the Reed-Solomon code, and provides the program codes to the dynamic memory 16. The processor 18 drives the receiver 12 to receive $0^{th}$ to $(n-1)^{th}$ symbols $r_0$ to $r_{n-1}$ in a Reed-Solomon block code through a wireless communication link 20 according to the program codes in the dynamic memory 16, and performs the corresponding decoding operation of the Reed-Solomon code.

In general, the Reed-Solomon block code is configured to be represented by Reed-Solomon (n,k), wherein n represents the number of symbols of each block after being encoded, k represents the number of the encoded message symbols of each block, and the following equation is satisfied:

$$t = \frac{(n-k)}{2},$$

wherein t represents the maximum number of errors that can be corrected. The syndrome is defined by the following equation:

$$s(x) = \sum_{i=1}^{2t} s_i x^{i-1}, \; s_i = r(x)\bigg|_{x=\alpha^i} = r(\alpha^i) = \sum_{j=0}^{n-1} (r_j \times (\alpha^i)^j).$$

The $s_i$ of the above-mentioned equation may be rearranged so that the syndrome vector S is represented by the following equation:

$$S = \begin{bmatrix} s_1 \\ s_2 \\ \vdots \\ s_{2t} \end{bmatrix} = \begin{bmatrix} r_0 \\ r_0 \\ \vdots \\ r_0 \end{bmatrix} + \begin{bmatrix} r_1 \times \alpha^1 \\ r_1 \times \alpha^2 \\ \vdots \\ r_1 \times \alpha^{2t} \end{bmatrix} + \begin{bmatrix} r_2 \times (\alpha^1)^2 \\ r_2 \times (\alpha^2)^2 \\ \vdots \\ r_2 \times (\alpha^{2t})^2 \end{bmatrix} + \dots + \begin{bmatrix} r_{n-1} \times (\alpha^1)^{n-1} \\ r_{n-1} \times (\alpha^2)^{n-1} \\ \vdots \\ r_{n-1} \times (\alpha^{2t})^{n-1} \end{bmatrix},$$

wherein j is a symbol index, $r_j$ is a $j^{th}$ symbol obtained from the Reed-Solomon code, $r_j$ and the known constant $\alpha$ pertain to finite field elements, and the above-mentioned equations pertain to finite field operations. The encoding and decoding principles of the Reed-Solomon code and the finite field operations thereof are constructed in the Galois field, so the $j^{th}$ symbol $r_j$ and the known constant $\alpha$ fall within the Galois field.

The known constant $\alpha$ is stored in the computer system medium 14. Because the steps of finding a product of the received data and the known constant $\alpha$ in any one syndrome polynomial of any one of the polynomials $S_1$ to $S_{2t}$ of the syndrome vector S are substantially similar to one another, illustrations will be made by taking the operation of finding the polynomial $S_1$ as an example.

Figure 3:
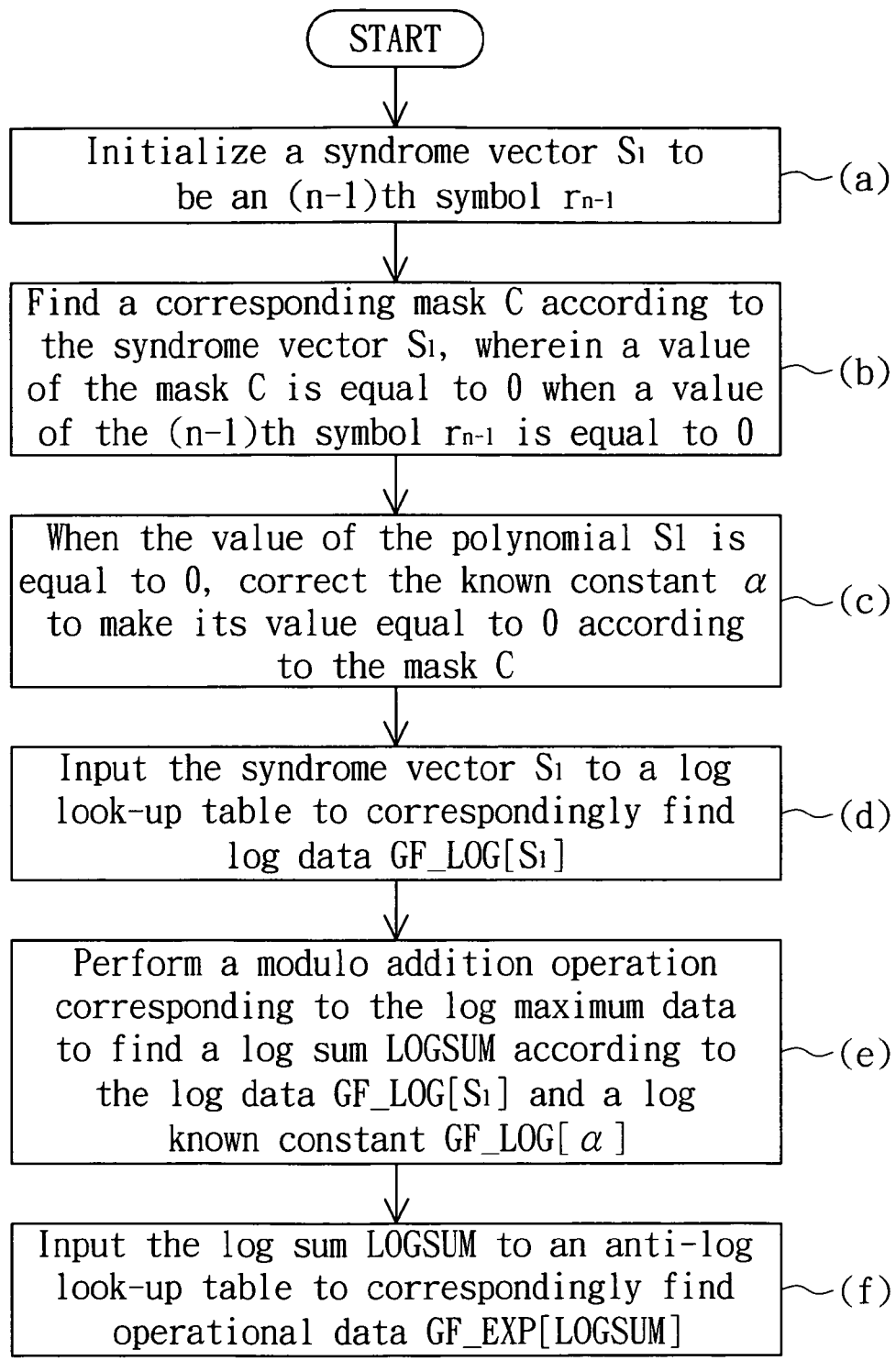
FIG. 3 is a flow chart showing the data processing method according to the embodiment of the invention.

FIG. 3 is a flow chart showing the data processing method according to the embodiment of the invention. First, as shown in step (a), the receiver 12 receives the $(n-1)^{th}$ symbol $r_{n-1}$, and the processor 18 initializes the polynomial $S_1$ to be equal to the $(n-1)^{th}$ symbol $r_{n-1}$. Next, as shown in step (b), the processor 18 generates the mask C according to the polynomial $S_1$, wherein the value of the mask C is equal to 0 when the value of the polynomial $S_1$ is equal to 0, and the value of the mask C is equal to a maximum data value when the value of the polynomial $S_1$ is not equal to 0. For example, the mask C includes eight bits and thus has the value ranging from 0 to 255. The value of the mask C is equal to $(00000000)_2$ when the value of the polynomial $S_1$ is equal to 0, and the value of the mask C is equal to a maximum data value $(11111111)_2$, i.e., the value 255, when the value of the polynomial $S_1$ is not equal to 0.

Next, as shown in step (c), the processor 18 reads the known constant $\alpha$ stored in the computer system medium 14, and corrects the known constant $\alpha$ according to the mask C. When the value of the polynomial $S_1$ is equal to 0, the processor 18 corrects the known constant $\alpha$ to make its value equal to 0. When the value of the polynomial $S_1$ is not equal to 0, the processor 18 holds the value of the known constant $\alpha$. The processor 18, for example, corrects the known constant $\alpha$ by performing an AND operation according to the mask C and the known constant $\alpha$.

Then, as shown in step (d), the computer system medium 14 loads the log look-up table GF_LOG to the dynamic memory 16, and the processor 18 finds the log data GF_LOG $[S_1]$ from the log look-up table GF_LOG according to the polynomial $S_1$. The log look-up table GF_LOG of this embodiment differs from the conventional log look-up table in that the log look-up table GF_LOG maps the polynomial $S_1$ to a sum of its corresponding log value $log(S_1)$ and 1 by the following equation:

GF_LOG $[S_1]$=log$(S_1)$+1.

For example, the output data set of the conventional log look-up table includes:

Output={-1 0 1 2 4 26 52 . . . }.

The output data set is such that the output data having the values equal to −1, 0, 1, 2, 4, 26, 52, . . . are correspondingly outputted when the input data values are respectively equal to 0, 1, 2, 3, 4, 5, 6, . . . , wherein the output data having the value equal to −1 serves as a judgement condition when the input data is equal to 0, for example. The input data is 0 when the value of the output data is equal to −1. At this time, the branched paths are performed to process the input data having the value equal to 0. For example, the output data set of the log look-up table GF_LOG of this embodiment includes:

Output={0 1 2 3 5 27 53 . . . }.

The value of each output data set is the sum of each value in the conventional log look-up table and 1, wherein the log look-up table GF_LOG outputs the values 0, 1, 2, 3, 5, 27, 53, . . . as the log data GF_LOG [$S_i$] when the values of the polynomial $S_1$ are respectively equal to 0, 1, 2, 3, 4, 5, 6 . . . . Thus, when the value of the polynomial $S_1$ is equal to 0, the log look-up table GF_LOG corresponding outputs the log data GF_LOG [$S_i$] having the value equal to 0.

Next, as shown in step (e), the processor 18 performs a modulo addition operation corresponding to the log maximum data, such as 255, according to the log data GF_LOG [$S_1$] and the log known constant GF_LOG [a] to find the log sum LOGSUM. The log known constant GF_LOG [a] satisfies:

GF_LOG [α]=log(α).

The log sum LOGSUM satisfies:

LOGSUM=Modulo{GF_LOG [$S_1$]+GF_LOG [α]}=Modulo{[log($S_1$)+log(α)]+1}.

When the sum of the log data GF_LOG [$S_1$] and the log known constant GF_LOG [a] is smaller than 255, the log sum LOGSUM substantially satisfies:

LOGSUM=log($S_1$)+log(α)+1=log($S_1$×α)+1.

Then, as shown in step (f), the computer system medium 14 loads the anti-log look-up table GF_EXP to the dynamic memory 16, and the processor 18 correspondingly finds operational data GF_EXP[LOGSUM] from the anti-log look-up table GF_EXP according to the log sum LOGSUM. The anti-log look-up table GF_EXP of this embodiment differs from the conventional anti-log look-up table in that the anti-log look-up table GF_EXP maps the log sum LOGSUM to the operation result obtained after the finite field multiplication operation according to the polynomial $S_1$ and the known constant α by the following equation:

GF_EXP[LOGSUM]=log$^{-1}$(LOGSUM−1)=log$^{-1}$[log($S_1$×α)]=$r_{n-1}$×α.

For example, the output data set of the conventional anti-log look-up table includes:

Output={1 2 4 . . . 0}.

The output data having the values equal to 1, 2, 4, . . . are correspondingly outputted when the values of the input data are equal to 0, 1, 2, . . . , respectively. The output data set of the anti-log look-up table GF_EXP of this embodiment includes:

Output={0 1 2 4 . . . }.

The value 0 is changed from the last position to the first position in the data set, and the positions of the other values are respectively shifted by one position rightwards. When the log sums LOGSUM are equal to 1, 2, 3, 4, the anti-log look-up table GF_EXP outputs the values 0, 1, 2, 4, . . . as the operational data GF_EXP[LOGSUM], respectively. Consequently, the anti-log look-up table GF_EXP of this embodiment may correspond the log sum LOGSUM to the value substantially equal to the operation result, which is obtained after the finite field multiplication operation is performed on the corresponding polynomial $S_1$ and the known constant α.

The finite field multiplication operation of the (n−1)$^{th}$ symbol $r_{n-1}$ and the known constant α can be effectively completed according to the steps (a) to (f) above.

Figure 4:
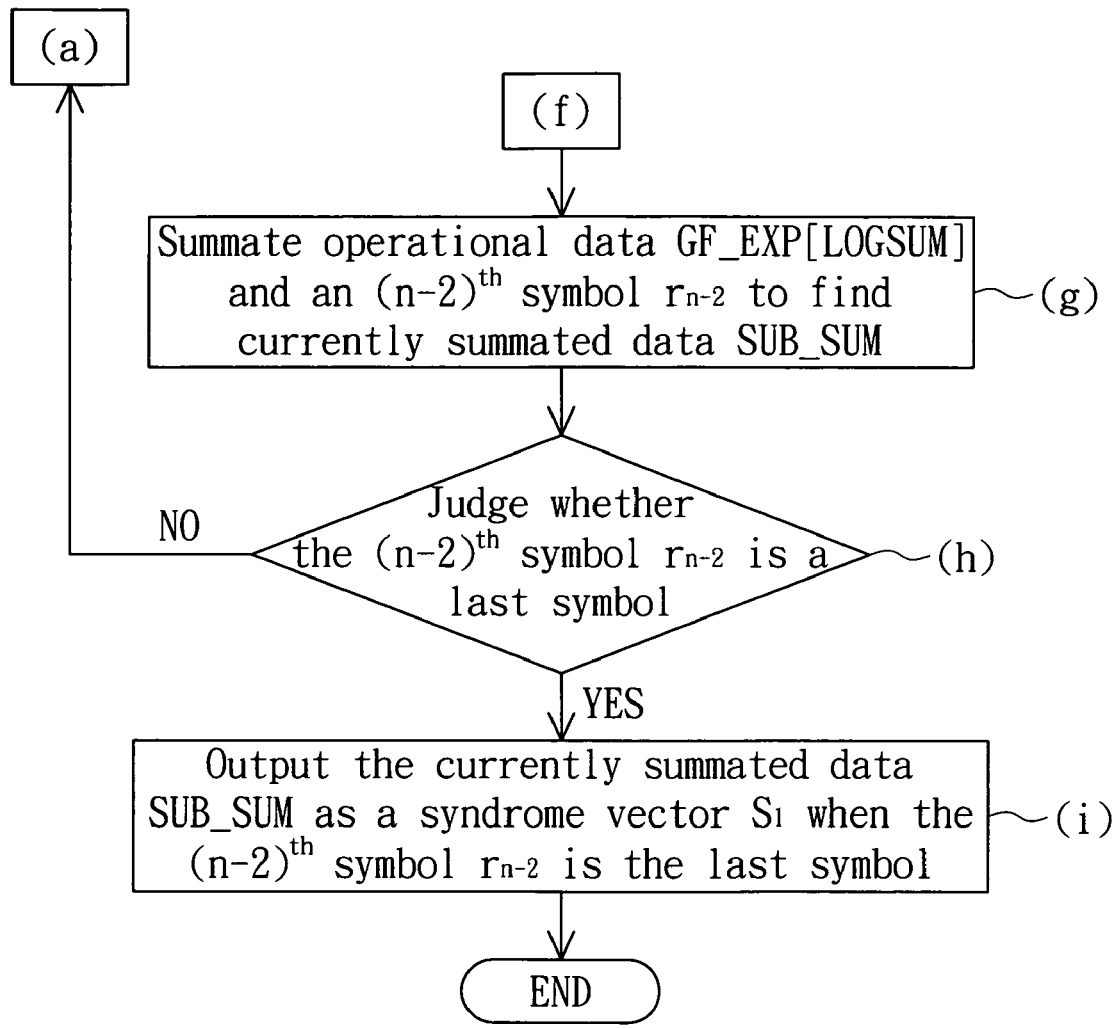
FIG. 4 is a partial flow chart showing the data processing method according to the embodiment of the invention.

FIG. 4 is a partial flow chart showing the data processing method according to the embodiment of the invention. Referring to FIG. 4, the method further includes, after the step (f), the step (g), in which the processor 18 summates the operational data GF_EXP[LOGSUM] and the currently received symbol (i.e., the (n−2)$^{th}$ symbol $r_{n-2}$) to find the currently summated data SUB_SUM, which satisfies the following equation:

SUB_SUM=GF_EXP[LOGSUM]+$r_{n-2}$=$r_{n-1}$×α+$r_{n-2}$.

Next, as shown in step (h), the processor 18 judges whether the currently received data $r_{n-2}$ is the last symbol, which is the 0$^{th}$ symbol $r_0$ in this embodiment. When the currently received data is not the last symbol, the processor 18 takes the currently summated data SUB_SUM as the polynomial $S_1$ and repeats the steps substantially similar to the steps (a) to (h) to receive an (n−3)$^{th}$ symbol $r_{n-3}$ and to find the corresponding currently summated data SUB_SUM. When the processor 18 receives the 0$^{th}$ symbol $r_0$ and finds the correspondingly summated data SUB_SUM according to the 0$^{th}$ symbol $r_0$ and the corresponding operational data GF_EXP[LOGSUM], the processor 18 judges that the currently received 0$^{th}$ symbol $r_0$ is the last symbol. At this time, the step (i) is performed, in which the processor 18 outputs the currently summated data SUB_SUM as the polynomial $S_1$.

In this embodiment, illustrations are made by taking the operation of the polynomial $S_1$ as an example. However, the operations corresponding to the polynomials $S_2$ to $S_{2t}$ may be derived according to the above-mentioned operations for the polynomial $S_1$.

As mentioned hereinabove, it is obtained that, when the value of the polynomial $S_i$ is equal to 0, the data processing method of this embodiment can map the polynomial $S_1$ having the value 0 to the log data GF_LOG [$S_1$] having the value 0 according to the modified log look-up table GF_LOG, and the anti-log look-up table GF_EXP can map the log sum LOGSUM to the operation result, which is obtained after the finite field multiplication operation is performed on the corresponding polynomial $S_1$ and the known constant α. Consequently, the data processing method of this embodiment always performs substantially the same operation step no matter whether the value of the polynomial $S_1$ is equal to 0 so that the branched operation step of calculating the conventional syndrome can be omitted. Because the branched operation step of calculating the conventional syndrome can be omitted, the processor 18 is free from guessing the path that may be adopted after the branching point, prevents the guess error from causing the instruction, which is pre-loaded to the pipe line of the processor 18, and prevents the pre-performed operation from becoming invalid so that the predicted result on the pipe line has to be discarded and the operation efficiency of the pipe line in the processor becomes poor.

In addition, when the processor 18 is a processor supporting the vectorization instruction set, the omission of the branched operation step enables the processor 18 to operate the 1$^{st}$ to (n−1)$^{th}$ symbols $r_0$ to $r_{n-1}$ in parallel through the vectorization instruction set in an instruction level. Thus, the operation speed of calculating the syndrome is increased. For example, performing 10,000 times of the data processing method of this embodiment takes the operation time of 73.9 microseconds (ms) under the environmental conditions, in which the computer system is a notebook computer, the processor 18 is Intel Pentium M 1.4 Giga Herz (GHz), and the system program is Microsoft Window XP. Compared with the operation time of 117.4 microseconds required when 10,000 times of the conventional finite field data processing method is performed, it is concluded that the operation speed of this invention is increased and becomes 1.59 times that of the prior art.

After performing the data processing method of this embodiment, the processor 18 further performs the operation steps of the error location polynomial operation, the Chien search and the Forney algorithm to proceed the decoding operation of the Reed-Solomon code according to other corresponding program codes in the dynamic memory 16.

In the data processing method of this embodiment, illustrations are made by taking the application of syndrome calculation of the decoding operation of the Reed-Solomon code as an example. However, the data processing method of this embodiment is not restricted thereto, and may further be applied to other occasions of the finite field data multiplication and addition operations.

In this embodiment, the illustrated example of the processor 18 is the Intel Pentium M processor. However, the processor 18 of this embodiment is not limited thereto, and any processor capable of supporting the vectorization instruction set may perform the data processing method of this embodiment.

The data processing method of this embodiment corrects the value of the known constant by modifying the contents of the log look-up table and the anti-log look-up table and by generating the mask so that the log data and the operational data each having the value 0 can be correspondingly found when the value of the polynomial is 0. Consequently, using the data processing method of this embodiment can effectively omit the branched operation step, which has to be performed in the conventional finite field data processing method after the step of judging whether the value of the polynomial is 0. Thus, compared with the conventional finite field data processing method, the data processing method of this embodiment advantageously has the shorter operation time and the higher operation speed.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A data processing method, comprising the steps of:
    (a) initializing a syndrome vector to be an $(n-1)^{th}$ symbol;
    (b) finding a corresponding mask based on the syndrome vector, wherein a value of the mask is equal to 0 when a value of the $(n-1)^{th}$ symbol is equal to 0;
    (c) correcting a known constant based on the mask, wherein a value of the known constant corrected based on the mask is equal to 0 when a value of the syndrome vector is equal to 0;
    (d) inputting the syndrome vector to a log look-up table to correspondingly find log data;
    (e) performing, based on the log data and a log known constant, a modulo addition operation corresponding to log maximum data to find a log sum; and
    (f) inputting the log sum to an anti-log look-up table to correspondingly find operational data.

2. The method according to claim 1, further comprising the steps of:
    (g) summating the operational data and an $(n-2)^{th}$ symbol to find currently summated data;
    (h) judging whether the $(n-2)^{th}$ symbol is a last symbol or not; and
    (i) outputting the currently summated data as the syndrome vector when the $(n-2)^{th}$ symbol is the last symbol.

3. The method according to claim 2, wherein when the $(n-2)^{th}$ symbol is not the last symbol, the currently summated data serves as the syndrome vector and the steps (b) to (h) are repeatedly performed.

4. The method according to claim 1, wherein in the step (d), the log data having a value equal to 0 is corresponding found according to the log look-up table when the value of the syndrome vector is equal to 0.

5. The method according to claim 4, wherein the log data and the syndrome vector satisfy the equation:

$$S2 = \log(S1) + 1,$$

wherein S1 and S2 are the syndrome vector inputted to the log look-up table and the log data corresponding found according to the log look-up table, respectively.

6. The method according to claim 1, wherein in the step (f), the operational data having a value equal to 0 is correspondingly found according to the anti-log look-up table when the log sum is equal to 1.

7. The method according to claim 1 being applied to a syndrome operation of a Reed-Solomon code.

8. The method according to claim 1, wherein in the step (b), the mask is equal to a maximum data value when the syndrome vector is not equal to 0.

9. The method according to claim 1, wherein in the step (c), the known constant is corrected by performing an AND operation according to the mask and the known constant.

10. A computer system medium having a computer-executable instruction for performing a data processing method, the data processing method comprising the steps of:
    (a) initializing a syndrome vector to be an $(n-1)^{th}$ symbol;
    (b) finding a corresponding mask according to the syndrome vector, wherein a value of the mask is equal to 0 when a value of the $(n-1)^{th}$ symbol is equal to 0;
    (c) correcting a known constant based on the mask, wherein a value of the known constant corrected based on the mask is equal to 0 when a value of the syndrome vector is equal to 0;
    (d) inputting the syndrome vector to a log look-up table to correspondingly find log data;
    (e) performing, based on the log data and a log known constant, a modulo addition operation corresponding to log maximum data to find a log sum; and
    (f) inputting the log sum to an anti-log look-up table to correspondingly find operational data.

11. The medium according to claim 10, wherein the data processing method further comprises the steps of:
    (g) summating the operational data and an $(n-2)^{th}$ symbol to find currently summated data;
    (h) judging whether the $(n-2)^{th}$ symbol is a last symbol or not; and
    (i) outputting the currently summated data as the syndrome vector when the $(n-2)^{th}$ symbol is the last symbol.

12. The medium according to claim 11, wherein when the $(n-2)^{th}$ symbol is not the last symbol, the currently summated data serves as the syndrome vector and the steps (b) to (h) are repeatedly performed.

13. The medium according to claim 10, wherein in the step (d), the log data having a value equal to 0 is corresponding found according to the log look-up table when the value of the syndrome vector is equal to 0.

14. The medium according to claim 13, wherein the log data and the syndrome vector satisfy the equation:

$$S2=\log(S1)+1,$$

wherein S1 and S2 are the syndrome vector inputted to the log look-up table and the log data corresponding found according to the log look-up table, respectively.

15. The medium according to claim 10, wherein in the step (f), the operational data having a value equal to 0 is correspondingly found according to the anti-log look-up table when the log sum is equal to 1.

16. The medium according to claim 10, wherein the data processing method is applied to a syndrome operation of a Reed-Solomon code.

17. The medium according to claim 10, wherein in the step (b) of the data processing method, the mask is equal to a maximum data value when the syndrome vector is not equal to 0.

18. The medium according to claim 10, wherein in the step (c), the known constant is corrected by performing an AND operation according to the mask and the known constant.

19. The medium according to claim 10 being applied to a computer system having a vectorization parallel processing instruction set, wherein the computer system performs the steps (a) to (f) of the data processing method on the symbols in response to instructions of the vectorization parallel processing instruction set.

* * * * *